(12) United States Patent
Im

(10) Patent No.: US 8,587,366 B2
(45) Date of Patent: Nov. 19, 2013

(54) SEMICONDUCTOR DEVICE

(75) Inventor: Jong-Man Im, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 25 days.

(21) Appl. No.: 13/333,888

(22) Filed: Dec. 21, 2011

(65) Prior Publication Data

US 2013/0113443 A1  May 9, 2013

(30) Foreign Application Priority Data

Nov. 8, 2011  (KR) .................. 10-2011-0116042

(51) Int. Cl.
*G05F 1/10* (2006.01)
*G05F 3/02* (2006.01)

(52) U.S. Cl.
USPC ........................................................ 327/536

(58) Field of Classification Search
USPC ................................ 327/536–538; 363/59–60
See application file for complete search history.

(56) References Cited

U.S. PATENT DOCUMENTS

| 6,124,732 A * | 9/2000 | Zilic et al. ...................... 326/63 |
| 6,201,437 B1 * | 3/2001 | Kono et al. .................... 327/545 |
| 7,521,988 B2 * | 4/2009 | Shin .............................. 327/536 |

FOREIGN PATENT DOCUMENTS

| KR | 1020020048266 | 6/2002 |
| KR | 1020030092584 | 12/2003 |
| KR | 1020040016069 | 2/2004 |

* cited by examiner

*Primary Examiner* — Quan Tra
(74) *Attorney, Agent, or Firm* — IP & T Group LLP

(57) ABSTRACT

A semiconductor device includes: a unit configured to, in a period before power up, compare a voltage obtained by dividing a voltage of a first voltage node at a first division ratio with a voltage obtained by dividing a voltage of a second voltage node at a second division ratio and determine whether to activate an enable signal according to a result of the comparison; and a voltage driving unit configured to increase the voltage of the second voltage node when the enable signal is activated in the period before power up.

15 Claims, 4 Drawing Sheets

SEMICONDUCTOR DEVICE

CROSS-REFERENCE TO RELATED APPLICATIONS

The present application claims priority of Korean Patent Application No. 10-2011-0116042, filed on Nov. 8, 2011, which is incorporated herein by reference in its entirety.

BACKGROUND

1. Field

Exemplary embodiments of the present invention relate to a semiconductor design technology, and more particularly, to a semiconductor device capable of stably generating an internal voltage even in a period before a complete power up.

2. Description of the Related Art

Many semiconductor devices such as dynamic random access memories (DRAMs) use not only power supply voltages (VDD, VSS and the like) supplied from the outside but also generate and se an internal voltage having a level different from that of a power supply voltage. Typically, an internal voltage is generated using a reference voltage corresponding to a target level of the internal voltage, an external power supply voltage VDD, and an external ground voltage VSS by charge pumping or voltage down converting.

In the case of a DRAM, an internal voltage generated using the charge pumping includes a boosting voltage VPP, a back bias voltage VBB, and the like. An internal voltage generated using the voltage down converting includes a core voltage VCORE, a bit line precharge voltage VBLP, and the like.

The boosting voltage VPP has a level higher than that of the external power supply voltage VDD and is mainly used to drive word lines. The back bias voltage VBB is a negative voltage lower than the ground voltage VSS and is mainly used as a body (bulk) bias of a cell transistor (a NMOS transistor).

FIG. 1 is a diagram illustrating a memory cell included in a semiconductor device according to the conventional art.

Referring to FIG. 1, the memory cell includes a cell transistor TR and a cell capacitor CP.

The cell transistor TR includes a NMOS transistor which is for forming a data transmission path SN between a bit line BL and the cell capacitor CP in response to the activation of a word line WL, provides a source-drain path between the bit line BL and the cell capacitor CP, and has a gate coupled to the word line WL. Accordingly, in order to form the data transmission path SN between the bit line BL and the cell capacitor CP, a boosting voltage VPP is supplied to the gate of the cell transistor TR.

Meanwhile, a power up operation indicates that a power supply voltage VDD has increased to a desired voltage level when a semiconductor device stably generates an internal voltage.

Accordingly, an internal voltage generation circuit of the semiconductor device generates an internal voltage in response to a power up control signal generated through the power up operation, and the internal voltage is initialized to a desired voltage level before the power up operation of a semiconductor device.

Specifically, in the memory cell of the semiconductor device as illustrated in FIG. 1, the data transmission path SN between the bit line BL and the cell capacitor CP is initialized to a ground voltage VSS. This is for substantially preventing latch up from occurring in the semiconductor device.

To this end, in the state in which the ground voltage VSS has been supplied to the bit line BL, a boosting voltage VPP is supplied to the word line WL to turn on the cell transistor TR, so that the ground voltage VSS of the bit line BL is transmitted to the data transmission path SN of the cell capacitor CP.

However, in the case of the conventional semiconductor device, before the power up operation, a node of the power supply voltage VDD and a node of the boosting voltage VPP are short-circuited to each other so that the power supply voltage VDD and the boosting voltage VPP have the same voltage level.

Therefore, even when the boosting voltage VPP is supplied to the word line WL before the power up operation, the cell transistor TR may not be sufficiently turned on.

Such a feature may occur more frequently in semiconductor devices in which the level of the power supply voltage VDD is reduced. Here, a latch up phenomenon may occur in the internal circuit of the semiconductor device and may damage the semiconductor device.

SUMMARY

An embodiment of the present invention is directed to a semiconductor device in which a boosting voltage VPP is substantially maintained at a voltage level higher than that of a power supply voltage VDD even in an operation period before power up.

Specifically, an embodiment of the present invention is directed to a semiconductor device in which a boosting voltage VPP is substantially maintained at a voltage level higher than that of a power supply voltage VDD in an operation period before power up, where a voltage level difference between the power supply voltage VDD and the boosting voltage VPP does not exceed a given voltage level.

In accordance with an embodiment of the present invention, a semiconductor device includes: a unit configured to, in a period before power up, compare a voltage obtained by dividing a voltage of a first voltage node at a first division ratio with a voltage obtained by dividing a voltage of a second voltage node at a second division ratio and determine whether to activate an enable signal according to a result of the comparison; and a voltage driving unit configured to increase the voltage of the second voltage node when the enable signal is activated in the period before power up.

In accordance with another embodiment of the present invention, a method for operating a semiconductor device includes: deactivating an enable signal when a difference between a voltage of a first voltage node and a voltage of a second voltage node is larger than a first voltage difference in a period before power up and activating the enable signal when the difference is smaller than the first voltage difference; and increasing the voltage of the second voltage node when the enable signal is activated in the period before power up.

In accordance with further another embodiment of the present invention, a method for operating a semiconductor device includes: activating a power up signal when a voltage of a first voltage node is higher than a first voltage and entering a period before power up; activating an oscillation enable signal when the voltage of the first voltage node is higher than a voltage of a second voltage node in the period before power up; deactivating the oscillation enable signal when the voltage of the second voltage node is higher than the voltage of the first voltage node by at least a first voltage difference in the period before power up; deactivating the power up signal when the voltage of the first voltage node is higher than a power-up threshold voltage and entering a period after power up; activating the oscillation enable signal when the voltage of the second voltage node is lower than a target voltage in the period after power up and deactivating the oscillation enable signal when the voltage of the second voltage node is higher than the target voltage; and increasing the voltage of the second voltage node in an activation period of the oscillation enable signal.

DETAILED DESCRIPTION

Figure 1:
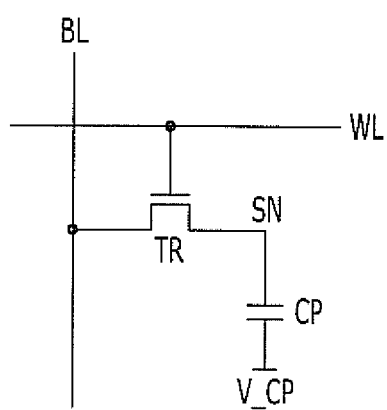
FIG. 1 is a diagram illustrating a memory cell included in a conventional semiconductor device.

Exemplary embodiments of the present invention will be described below in more detail with reference to the accompanying drawings. The present invention may, however, be embodied in different forms and should not be construed as limited to the exemplary embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
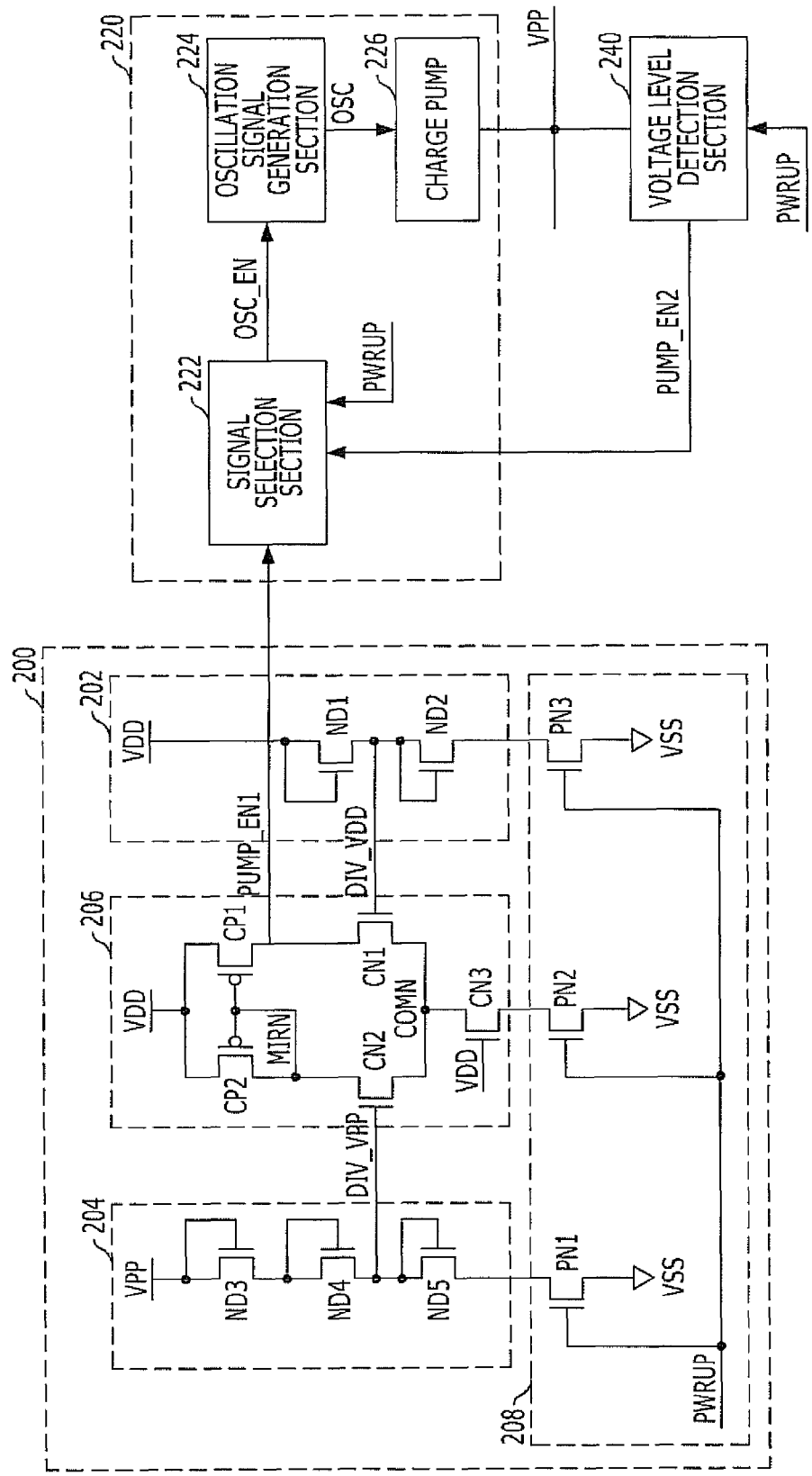
FIG. 2 is a diagram illustrating a boosting voltage generation circuit of a semiconductor device in accordance with an embodiment of the present invention.

FIG. 2 is a diagram illustrating a boosting voltage generation circuit of a semiconductor device in accordance with an embodiment of the present invention.

Referring to FIG. 2, the boosting voltage generation circuit of the semiconductor device in accordance with the exemplary embodiment of the present invention includes a unit 200 for controlling an operation before power up, a charge pumping unit 220, and a voltage level detection unit/section 240. The unit 200 includes a power supply voltage division section 202, a boosting voltage division section 204, a voltage level comparison section 206, and an operation control section 208. The charge pumping unit 220 includes a signal selection section 222, an oscillation signal generation section 224, and a charge pump 226.

The unit 200 is configured to compare the level of a voltage DIV_VDD, which is obtained by dividing a voltage level of a node of a power supply voltage VDD at a desired first division ratio in a period before power up, with the level of a voltage DIV_VPP, which is obtained by dividing a voltage level of a node of a boosting voltage VPP at a desired second division ratio, and determines whether to activate a pumping enable signal PUMP_EN1 according to a comparison result.

More specifically, when the level of the voltage DIV_VPP obtained by dividing the voltage level of the node of the boosting voltage VPP at the desired second division ratio is smaller than the level of the voltage DIV_VDD obtained by dividing the voltage level of the node of the power supply voltage VDD at the desired first division ratio in the period before the power up in which a power up signal PWRUP is activated, the unit 200 activates and outputs the pumping enable signal PUMP_EN. Meanwhile, when the level of the voltage DIV_VPP obtained by dividing the voltage level of the node of the boosting voltage VPP at the desired second division ratio is larger than the level of the voltage DIV_VDD obtained by dividing the voltage level of the node of the power supply voltage VDD at the desired first division ratio in the period before the power up, the unit 200 deactivates and outputs the pumping enable signal PUMP_EN. In a period after the power up in which the power up signal PWRUP is deactivated, the unit 200 performs no operations.

The power supply voltage division section 202 of the unit 200 is configured to divide the voltage level of the node of the power supply voltage VDD at the desired first division ratio and generate the divided power supply voltage DIV_VDD.

In detail, the power supply voltage division section 202 includes a plurality of resistors such that a division ratio of a resistance value set between the node of the power supply voltage VDD and a node of the divided power supply voltage DIV_VDD and a resistance value set between the node of the divided power supply voltage DIV_VDD and a node of a ground voltage VSS is the desired first division ratio.

For example, the first division ratio may be set such that the voltage level of the node of the power supply voltage VDD is divided by 2 as illustrated in the drawing. To this end, the power supply voltage division section 202 includes a first diode type NMOS transistor ND1 and a second diode type NMOS transistor ND2 such that the resistance value set between the node of the power supply voltage VDD and a node of the divided power supply voltage DIV_VDD is substantially equal to the resistance value set between the node of the divided power supply voltage DIV_VDD and the node of the ground voltage VSS.

In addition to the second diode type NMOS transistor ND2, a third power up control NMOS transistor PN3 included in the operation control section 208 is connected between the node of the divided power supply voltage DIV_VDD and the node of the ground voltage VSS. Since a resistance value which may be set by the first diode type NMOS transistor ND1 and the second diode type NMOS transistor ND2 is significantly larger than a resistance value which may be set by the third power up NMOS transistor PN3, the third power up NMOS transistor PN3 does not have a significant influence when the division ratio of the resistance value set between the node of the power supply voltage VDD and the node of the divided power supply voltage DIV_VDD and the resistance value set between the node of the divided power supply voltage DIV_ VDD and the node of the ground voltage VSS is set to be substantially equal to the desired first division ratio.

Even when the resistance value of the third power up NMOS transistor PN3 is larger than a desired value, a resistance value obtained by adding the resistance value of the second diode type NMOS transistor ND2 to the resistance value of the third power up NMOS transistor PN3 is set to be substantially equal to the resistance value of the first diode type NMOS transistor ND1 such that the resistance value set between the node of the power supply voltage VDD and the node of the divided power supply voltage DIV_VDD is substantially equal to the resistance value set between the node of the divided power supply voltage DIV_VDD and the node of the ground voltage VSS.

Furthermore, the boosting voltage division section 204 of the unit 200 is configured to divide the voltage level of the node of the boosting voltage VPP by the second division ratio and generate the divided power supply voltage DIV_VDD.

In detail, the boosting voltage division section 204 includes a plurality of resistors such that a division ratio of a resistance value set between the node of the boosting voltage VPP and a node of the divided boosting voltage DIV_VPP and a resistance value set between the node of the divided boosting voltage DIV_VPP and the node of the ground voltage VSS is the desired second division ratio.

Figure 3A:
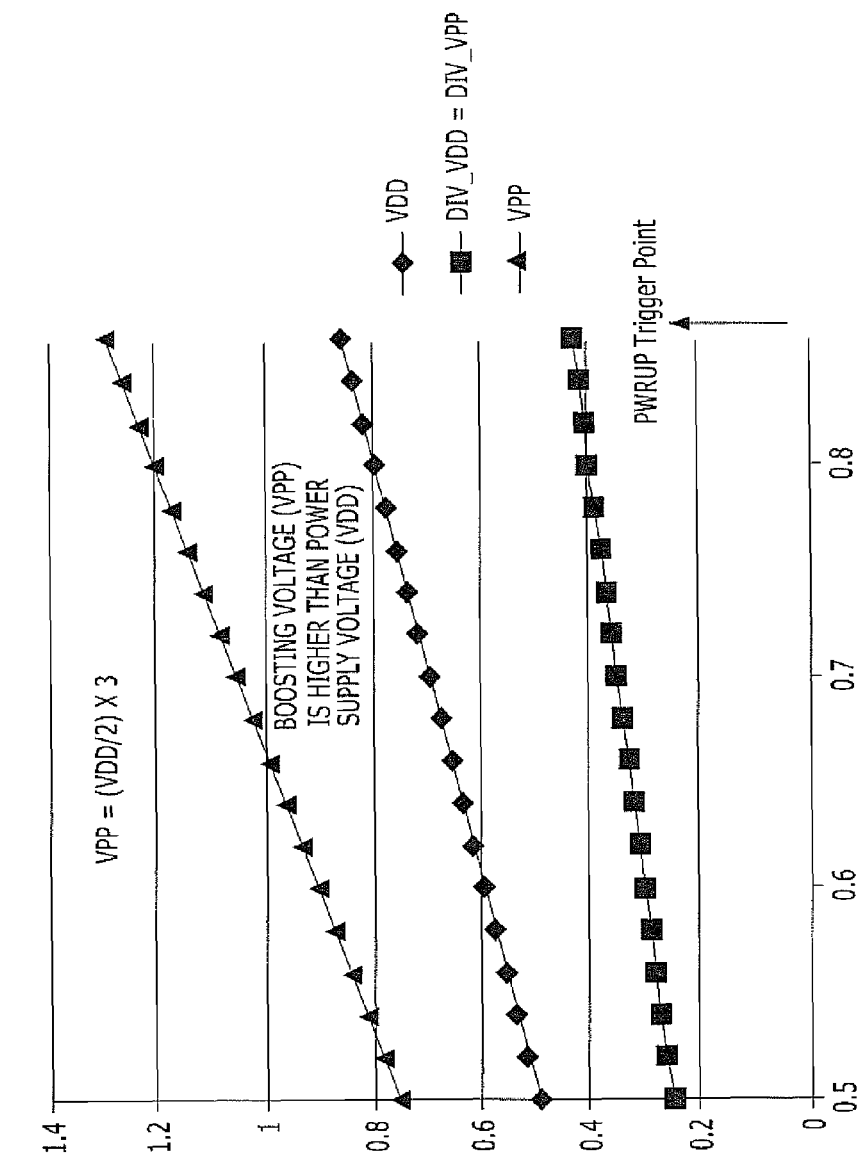
FIG. 3A and FIG. 3B are diagrams illustrating an operation simulation waveform of a boosting voltage generation circuit of a semiconductor device illustrated in FIG. 2 in accordance with an embodiment of the present invention.

For example, the second division ratio may be set such that the voltage level of the node of the boosting voltage VPP is divided by 3 as illustrated in the drawing for FIG. 3A. To this end, the power supply voltage division section 202 includes a third diode type NMOS transistor ND3, a fourth diode type NMOS transistor ND4, and a fifth diode type NMOS transistor ND5 such that the resistance value set between the node of the boosting voltage VPP and the node of the divided boosting voltage DIV_VPP is twice as large as the resistance value set between the node of the divided boosting voltage DIV_VPP and the node of the ground voltage VSS.

In addition to the fifth diode type NMOS transistor ND5, a first power up control NMOS transistor PN1 included in the operation control section 208 is connected between the node of the divided boosting voltage DIV_VPP and the node of the ground voltage VSS. Since a resistance value which may be set by the third diode type NMOS transistor ND3, the fourth diode type NMOS transistor ND4, and the fifth diode type NMOS transistor ND5 is significantly larger than a resistance value which may be set by the first power up NMOS transistor PN1, the first power up NMOS transistor PN1 does not have a significant influence when the division ratio of the resistance value set between the node of the boosting voltage VPP and the node of the divided boosting voltage DIV_VPP and the resistance value set between the node of the divided boosting voltage DIV_VPP and the node of the ground voltage VSS is set to be substantially equal to the desired second division ratio.

Even when the resistance value of the first power up NMOS transistor PN1 is larger than a desired value, a resistance value obtained by adding the resistance value of the third diode type NMOS transistor ND3 to the resistance value of the fourth diode type NMOS transistor ND4 is set to be twice as large as a resistance value obtained by adding the resistance value of the fifth diode type NMOS transistor ND5 to the resistance value of the first power up NMOS transistor PN1 such that the resistance value set between the node of the boosting voltage VPP and the node of the divided boosting voltage DIV_VPP is twice as large as the resistance value set between the node of the divided boosting voltage DIV_VPP and the node of the ground voltage VSS.

As described in relation to the power supply voltage division section 202 and the boosting voltage division section 204, according to an example, the first division ratio is larger than the second division ratio. This is because the level of the boosting voltage VPP is generally larger than the level of the power supply voltage VDD.

Furthermore, since the first division ratio is larger than the second division ratio, according to an example, when the level of the divided power supply voltage DIV_VDD obtained by dividing the voltage level of the node of the power supply voltage VDD by the first division ratio may be set to substantially equal the level of the divided boosting voltage DIV_VPP obtained by dividing the voltage level of the node of the boosting voltage VPP by the second division ratio. Here, the voltage level of the node of the power supply voltage VDD is lower than the voltage level of the node of the boosting voltage VPP.

Furthermore, since the first division ratio and the second division ratio may be set differently according to different design needs, a voltage level difference between the level of the node of the power supply voltage VDD and the level of the node of the boosting voltage VPP may be adjusted according to a change in the level of the node of the power supply voltage VDD.

More specifically, an absolute voltage level value corresponding to the voltage level difference set between the node of the power supply voltage VDD and the node of the boosting voltage VPP in the state where the level of the node of the power supply voltage VDD is relatively low is smaller than an absolute voltage level value corresponding to the voltage level difference set between the node of the power supply voltage VDD and the node of the boosting voltage VPP in the state where the level of the node of the power supply voltage VDD is relatively high.

An example is illustrated in the table of FIG. 3A, where the voltage level difference set between the level of the node of the power supply voltage VDD and the level of the node of the boosting voltage VPP is adjusted according to a change in the node of the power supply voltage VDD based on the assumption that the first division ratio is 2 and the second division ratio is 3.

The voltage level comparison section 206 of the unit 200 is configured to compare the level of the divided power supply voltage DIV_VDD with the level of the divided boosting voltage DIV_VPP and determine whether to activate the pumping enable signal PUMP_EN1 according to a comparison result.

More specifically, when the level of the divided boosting voltage DIV_VPP is lower than the level of the divided power supply voltage DIV_VDD, the voltage level comparison section 206 activates and outputs the pumping enable signal PUMP_EN. Meanwhile, when the level of the divided boosting voltage DIV_VPP is higher than the level of the divided power supply voltage DIV_VDD, the voltage level comparison section 206 deactivates and outputs the pumping enable signal PUMP_EN.

In detail, the voltage level comparison section 206 includes a first input NMOS transistor CN1, a second input NMOS transistor CN2, a first current mirroring PMOS transistor CP1, a second current mirroring PMOS transistor CP2, and a sinking NMOS transistor CN3. The first input NMOS transistor CN1 has a gate to which the node of the divided power supply voltage DIV_VDD is coupled, a drain to which the node of the pumping enable signal PUMP_EN1 is coupled, and a source to which a common node COMN is coupled. The second input NMOS transistor CN2 has a gate to which the node of the divided boosting voltage DIV_VPP is coupled, a drain to which a current mirroring node MIRN is coupled, and a source to which the common node COMN is coupled. The first current mirroring PMOS transistor CP1 has a gate coupled to the current mirroring node MIRN, a source coupled to the node of the power supply voltage VDD, and a drain coupled to the node of the pumping enable signal PUMP_EN1. The second current mirroring PMOS transistor CP2 has a gate and a drain commonly coupled to the current mirroring node MIRN, and a source coupled to the node of the power supply voltage VDD. The sinking NMOS transistor CN3 has a gate to which the node of the power supply voltage VDD is coupled, a drain coupled to the common node COMN, and a source coupled to the node of the ground voltage VSS through the operation control section 208. The sinking NMOS transistor CN3 allows a sink current flowing from the common node COMN to be constant.

The operation control section 208 of the unit 200 is configured to turn on/off the operations of the power supply voltage division section 202, the boosting voltage division section 204, and the voltage level comparison section 206 in response to the power up signal PWRUP.

More specifically, the operation control section 208 turns on the operations of the power supply voltage division section 202, the boosting voltage division section 204, and the voltage level comparison section 206 such that an operating current may be supplied to the power supply voltage division section 202, the boosting voltage division section 204, and the voltage level comparison section 206 in an operation period before the power up in which the power up signal PWRUP is activated to a logic 'high' level, and turns off the operations of the power supply voltage division section 202, the boosting voltage division section 204, and the voltage level comparison section 206 such that the operating current is prevented from being supplied to the power supply voltage division section 202, the boosting voltage division section 204, and the voltage level comparison section 206 in an operation period after the power up in which the power up signal PWRUP is deactivated to a logic 'low' Low.

In detail, the operation control section 208 includes a first power up NMOS transistor PN1, a second power up NMOS transistor PN2, and a third power up NMOS transistor PN3. The first power up NMOS transistor PN1 performs on/off control of a connection between the boosting voltage division section 204 and the node of the ground voltage VSS in response to the power up signal PWRUP. The second power up NMOS transistor PN2 performs on/off control of a connection between the voltage level comparison section 206 and the node of the ground voltage VSS in response to the power up signal PWRUP. The third power up NMOS transistor PN3 performs on/off control of a connection between the power supply voltage division section 202 and the node of the ground voltage VSS in response to the power up signal PWRUP.

When the pumping enable signal PUMP_EN1 is activated in the period before the power up, the charge pumping unit 220 performs a charge pumping operation, resulting in an increase in the voltage level of the node of the boosting voltage VPP. Meanwhile, when the pumping enable signal PUMP_EN1 is deactivated in the period before the power up, the charge pumping unit 220 does not perform the charge pumping operation, thereby having no influence on a change in the voltage level of the node of the boosting voltage VPP.

Furthermore, when a second pumping enable signal PUMP_EN2 is activated in the period after the power up, the charge pumping unit 220 performs the charge pumping operation, resulting in an increase in the voltage level of the node of the boosting voltage VPP. Meanwhile, when the second pumping enable signal PUMP_EN2 is deactivated in the period after the power up, the charge pumping unit 220 does not perform the charge pumping operation, thereby having no influence on the voltage level of the node of the boosting voltage VPP.

At this time, an element for determining whether to activate the second pumping enable signal PUMP_EN2 for controlling the operation of the charge pumping unit 220 in the period after the power up is the voltage level detection unit 240.

More specifically, the voltage level detection unit 240 detects the voltage level of the node of the boosting voltage VPP in the period after the power up and determines whether to activate the second pumping enable signal PUMP_EN2 in response to a detection result.

In detail, when the voltage level of the node of the boosting voltage VPP is lower than a desired target voltage level in the period after the power up in which the power up signal PWRUP is deactivated, the voltage level detection unit 240 activates and outputs the second pumping enable signal PUMP_EN2. Meanwhile, when the voltage level of the node of the boosting voltage VPP is higher than the desired target voltage level in the period after the power up, the voltage level detection unit 240 deactivates and outputs the second pumping enable signal PUMP_EN2.

At this time, the operation enable signal of the charge pumping unit 220 is selected in the operation period before the power up in which the power up signal PWRUP is activated and the operation period after the power up in which the power up signal PWRUP is deactivated. More specifically, in the operation period before the power up, the activation of the charge pumping operation of the charge pumping unit 220 is determined in response only to the pumping enable signal PUMP_EN1 regardless of the value of the second pumping enable signal PUMP_EN2. In the operation period after the power up, the activation of the charge pumping operation of the charge pumping unit 220 is determined in response only to the second pumping enable signal PUMP_EN2 regardless of the value of the pumping enable signal PUMP_EN1.

Thus, the signal selection section 222 of the charge pumping unit 220 is configured to select one of the pumping enable signal PUMP_EN1 and the second pumping enable signal PUMP_EN2 in response to the power up signal PWRUP for distinguishing between the operation period before the power up from the operation period after the power up and output an oscillation enable signal OSC_EN.

More specifically, the signal selection section 222 outputs the pumping enable signal PUMP_EN1 as the oscillation enable signal OSC_EN in the operation period before the power up in which the power up signal PWRUP is activated and outputs the second pumping enable signal PUMP_EN2 as the oscillation enable signal OSC_EN in the operation period after the power up in which the power up signal PWRUP is deactivated.

The oscillation signal generation section 224 of the signal selection section 222 is configured to generate an oscillation signal OSC oscillating at a given frequency in a period in which the oscillation enable signal OSC_EN is activated.

More specifically, in the operation period before the power up in which the power up signal PWRUP is activated, when the voltage level of the node of the boosting voltage VPP is lower than the voltage level of the node of the power supply voltage VDD or is higher than the voltage level of the node of the power supply voltage VDD by a voltage smaller than or equal to a threshold voltage level difference and the power up signal PWRUP is activated, the oscillation signal generation section 224 generates an oscillation signal OSC oscillating at a given frequency. When the voltage level of the node of the boosting voltage VPP is higher than the voltage level of the node of the power supply voltage VDD by the threshold voltage level difference or more, and the power up signal PWRUP is deactivated, the oscillation signal generation section 224 generates an oscillation signal OSC which is fixed to a constant logic level and does not oscillate.

Furthermore, in the operation period after the power up in which the power up signal PWRUP is deactivated, when the voltage level of the node of the boosting voltage VPP is lower than a desired target voltage level and a power up signal PWRUP is activated, the oscillation signal generation section 224 generates the oscillation signal OSC oscillating at the given frequency. When the voltage level of the node of the boosting voltage VPP is higher than the desired target voltage level and the power up signal PWRUP is deactivated, the oscillation signal generation section 224 generates the oscillation signal OSC which is fixed to the constant logic level and does not oscillate.

When the oscillation signal OSC oscillates at the given frequency, the charge pump 226 of the charge pumping unit 220 performs the charge pumping operation in response to the oscillation of the oscillation signal OSC and increases the voltage level of the node of the booting voltage VPP. Meanwhile, when the oscillation signal OSC is fixed to the constant logic level and does not oscillate, the charge pump 226 does not perform the charge pumping operation in response to the non-oscillation of the oscillation signal OSC, thereby having no influence on the voltage level of the node of the boosting voltage VPP.

Figure 3B:
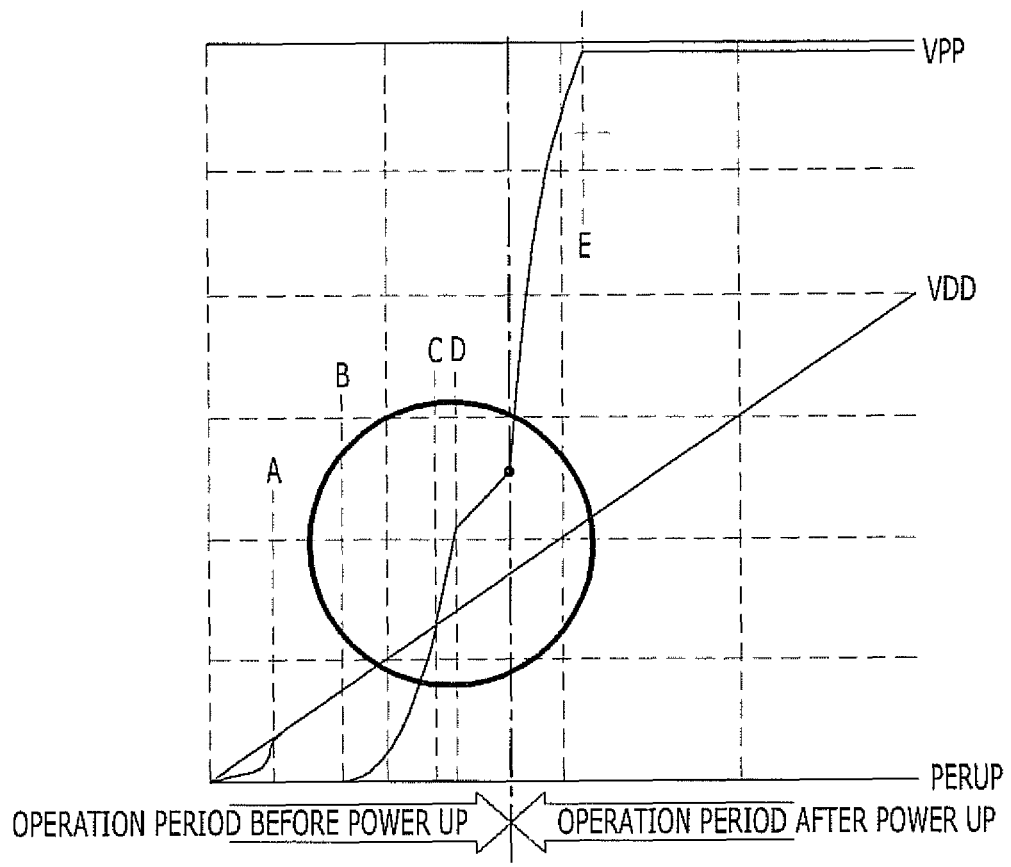

FIG. 3A and FIG. 3B are diagrams illustrating an operation simulation waveform of the boosting voltage generation circuit of the semiconductor device illustrated in FIG. 2 in accordance with an embodiment of the present invention.

FIG. 3A illustrates an ideal operation simulation waveform of the boosting voltage generation circuit of the semiconductor device illustrated in FIG. 2 in accordance with the exemplary embodiment of the present invention.

In detail, as the voltage level of the node of the power supply voltage VDD is sequentially increased from 0.5 V to 0.86 V, the voltage level of the node of the boosting voltage VPP is also sequentially increased from 0.75 V to 1.29 V.

More specifically, the unit 200 operates so that the level of the divided power supply voltage DIV_VDD obtained by dividing the voltage level of the node of the power supply voltage VDD by the first division ratio of 2 is substantially equal to the level of the divided boosting voltage DIV_VPP obtained by dividing the voltage level of the node of the boosting voltage VPP by the second division ratio of 3.

Consequently, since the voltage level of the node of the boosting voltage VPP is driven to a voltage level (VDD/2)*3 obtained by dividing the voltage level of the node of the power supply voltage VDD by 2 and multiplying the division result by 3, the voltage level of the node of the boosting voltage VPP does not become lower than the voltage level of the node of the power supply voltage VDD.

FIG. 3B illustrates an ideal operation simulation waveform when the boosting voltage generation circuit of the semiconductor device illustrated in FIG. 2 in accordance with the exemplary embodiment of the present invention has been actually applied to a semiconductor device.

In detail, if the voltage level of the node of the power supply voltage VDD is increased from 0 V, the power up signal PWRUP is substantially equal to the voltage level of the node of the power supply voltage VDD and is activated at time point (A). However, since the voltage level of the node of the power supply voltage VDD is low, the voltage level of the node of the boosting voltage VPP is still 0 V.

Subsequently, if the voltage level of the node of the power supply voltage VDD is continuously increased and reaches a desired time point (B), the voltage level of the node of the boosting voltage VPP starts to increase. At this time, the unit 200 in accordance with the exemplary embodiment of the present invention starts to operate.

More specifically, if the voltage level of the node of the power supply voltage VDD is increased for the unit 200 and reaches the time point (B) at which the voltage level of the node of the power supply voltage VDD may start to be compared with the voltage level of the node of the boosting voltage VPP, the pumping enable signal PUMP_EN1 is activated, resulting in an increase in the voltage level of the node of the boosting voltage VPP. At this time, since the voltage level of the node of the boosting voltage VPP is lower than the voltage level of the node of the power supply voltage VDD, the pumping enable signal PUMP_EN1 is in an activation state (for example, at a low level logic), so that the charge pumping unit 220 increases the voltage level of the node of the boosting voltage VPP.

Thus, the voltage level of the node of the boosting voltage VPP is rapidly increased and is continuously increased even after the time point (C) at which the voltage level of the node of the boosting voltage VPP is higher than the voltage level of the node of the power supply voltage VDD. This is because the unit 200 in accordance with the exemplary embodiment of the present invention continuously maintains the pumping enable signal PUMP_EN1 in the activation state until the voltage level of the node of the boosting voltage VPP is higher than the voltage level of the node of the power supply voltage VDD by a threshold voltage level or more.

Subsequently, the time point (D), at which the degree of an increase in the voltage level of the node of the boosting voltage VPP starts to be reduced and becomes similar to the degree of an increase in the voltage level of the node of the power supply voltage VDD, exists in the operation period before the power up. At the time point (D), the voltage level of the node of the boosting voltage VPP is increased beyond the voltage level of the node of the power supply voltage VDD by a threshold voltage level difference or more. Thus, the unit 200 in accordance with the exemplary embodiment of the present invention operates to substantially maintain the state in which the level of the divided power supply voltage DIV_VDD obtained by dividing the voltage level of the node of the power supply voltage VDD by the desired first division ratio is substantially equal to the level of the divided boosting voltage DIV_VPP obtained by dividing the voltage level of the node of the boosting voltage VPP by the second division ratio and determines whether to activate the pumping enable signal PUMP_EN1. More specifically, the unit 200 operates such that the threshold voltage level difference is substantially maintained between the voltage level of the node of the power supply voltage VDD and the voltage level of the node of the boosting voltage VPP and determines whether to activate the pumping enable signal PUMP_EN1.

At this time, the voltage level of the node of the boosting voltage VPP is stably increased according to the degree by which the voltage level of the node of the power supply voltage VDD is increased. This is because the unit 200 in accordance with the exemplary embodiment of the present invention deactivates the pumping enable signal PUMP_EN1 when the voltage level of the node of the boosting voltage VPP is increased beyond the voltage level of the node of the power supply voltage VDD by the threshold voltage level difference or more and activates the pumping enable signal PUMP_EN1, for example, only when the voltage level of the node of the boosting voltage VPP is increased beyond the voltage level of the node of the power supply voltage VDD by the threshold voltage level difference or less.

More specifically, the unit 200 in accordance with the exemplary embodiment of the present invention operates to substantially prevent the voltage level of the node of the boosting voltage VPP from being increased over a threshold voltage. Consequently, a current is prevented from being excessively used in order to increase the voltage level of the node of the boosting voltage VPP in the operation period before the power up. Here, since the voltage level of the node of the boosting voltage VPP is maintained to be higher than the voltage level of the node of the power supply voltage VDD by the threshold voltage level, the voltage level of the node of the boosting voltage VPP is stably increased in the state in which the threshold voltage level difference is substantially maintained between the voltage level of the node of the boosting voltage VPP and the voltage level of the node of the power supply voltage VDD.

As described above, through the unit 200 in accordance with the exemplary embodiment of the present invention, the threshold voltage level difference can be substantially maintained between the voltage level of the node of the boosting voltage VPP and the voltage level of the node of the power supply voltage VDD even in the operation period before the power up, and the voltage level of the node of the boosting voltage VPP can be prevented from being excessively increased.

Furthermore, while the voltage level of the power up signal PWRUP is increased to equal the voltage level of the node of the power supply voltage VDD increases and is substantially maintained in an activation state, if the voltage level of the node of the power supply voltage VDD is increased to exceed a given voltage level, the voltage level of the power up signal PWRUP is deactivated to be at the ground voltage VSS.

Therefore, the operation period before the power up ends and the operation period after the power up starts.

After the complete power up, the unit 200 in accordance with the exemplary embodiment of the present invention does not perform any operations, so that the activation or deactivation of the pumping enable signal PUMP_EN1 has no influence on the voltage level of the node of the boosting voltage VPP.

Simultaneously, the voltage level detection unit 240 starts to operate to detect whether the voltage level of the node of the boosting voltage VPP is lower or higher than a target voltage level and determines whether to activate the second pumping enable signal PUMP_EN2. The second pumping enable signal PUMP_EN2 determined as above is used to control the charge pumping operation of the charge pumping unit 220.

Thus, from the starting time point in the operation period after the complete power up, the voltage level of the node of the boosting voltage VPP is rapidly increased.

Subsequently, when the voltage level of the node of the boosting voltage VPP reaches the time point (E) at which the target voltage level is reached, the voltage level of the node of the boosting voltage VPP is not increased. Thereafter, the voltage level of the node of the boosting voltage VPP is continuously maintained to equal the target voltage level, regardless of an increase in the voltage level of the node of the power supply voltage VDD.

As described above, according to the exemplary embodiment of the present invention, the voltage level of the node of the boosting voltage VPP can be substantially maintained at a high voltage level above the voltage level of the node of the power supply voltage VDD by the threshold voltage level difference even in the operation period before the power up.

Consequently, an internal circuit can be effectively initialized even in the operation period before the power up, wherein the turn on operation of the internal circuit is determined in response to the boosting voltage VPP as with the cell transistor of a DRAM.

Furthermore, the voltage level of the node of the boosting voltage VPP can be substantially maintained at a high voltage level above the voltage level of the node of the power supply voltage VDD by the threshold voltage level difference in the operation period before the power up, and the voltage level of the node of the boosting voltage VPP is substantially prevented from being increased above such a voltage level, so that the amount of a current used is prevented from being excessively increased in the operation period before the power up.

According to the present invention as described above, the voltage level of the node of the boosting voltage VPP can be substantially maintained at a high voltage level above the voltage level of the node of the power supply voltage VDD by the threshold voltage level difference even in the operation period before the power up.

Consequently, an internal circuit can be effectively initialized even in the operation period before the power up, wherein the activation or deactivation of the internal circuit is determined in response to the boosting voltage VPP.

Furthermore, the voltage level of the node of the boosting voltage VPP can be substantially prevented from being increased too much in the operation period before the power up.

Consequently, the amount of a current used is prevented from being excessively increased in the operation period before the power up.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a unit configured to, in a period before power up, compare a voltage obtained by dividing a voltage of a first voltage node at a first division ratio with a voltage obtained by dividing a voltage of a second voltage node at a second division ratio and determine whether to activate an enable signal according to a result of the comparison;
   a voltage driving unit configured to increase the voltage of the second voltage node when the enable signal is activated in the period before power up; and
   a voltage detection section configured to detect the voltage of the first voltage node in a period after power up and determine whether to activate a second enable signal according to a result of the voltage detection in the period after power up,
   wherein the voltage driving unit is configured to increase the voltage of the second voltage node when the second enable signal is activated in the period after power up,
   wherein the voltage driving unit comprises:
      a signal selection section configured to select one of the enable signal and the second enable signal in response to a power up signal and output an oscillation enable signal in response to the selection;
      an oscillation signal generation section configured to generate an oscillation signal in an activation period of the oscillation enable signal; and
      a charge pump configured to perform a charge pumping operation in response to oscillation of the oscillation signal and increase the voltage of the second voltage node.

2. The semiconductor device of claim 1, wherein the unit comprises:
   a first voltage division section configured to divide the voltage of the first voltage node at the first division ratio to generate a first divided voltage;
   a second voltage division section configured to divide the voltage of the second voltage node at the second division ratio to generate a second divided voltage;
   a voltage comparison section configured to compare the first divided voltage with the second divided voltage and determine whether to activate the enable signal according to a result of the comparison of the first and second divided voltages; and
   an operation control section configured to turn on/off operations of the first voltage division section, the second voltage division section, and the voltage comparison section in response to a power up signal.

3. The semiconductor device of claim 2, wherein the second division ratio has a value larger than the first division ratio, and when the first divided voltage is equal to the second divided voltage, the voltage of the first voltage node is lower than the voltage of the second voltage node.

4. The semiconductor device of claim 3, wherein a voltage difference between the voltages of the first and second voltage nodes is adjusted in response to a change in the voltage of the first voltage node.

5. The semiconductor device of claim 4, wherein the voltage of the first voltage node is a power supply voltage and the voltage of the second voltage is a boosting voltage.

6. A method for operating a semiconductor device, comprising:
   deactivating an enable signal when a difference between a voltage of a first voltage node and a voltage of a second voltage node is larger than a first voltage difference in a period before power up and activating the enable signal when the difference is smaller than the first voltage difference;
   increasing the voltage of the second voltage node when the enable signal is activated in the period before power up;
   detecting the voltage of the second voltage node in a period after power up and determining whether to activate a second enable signal according to a result of the detection of the voltage of the second voltage node; and
   increasing the voltage of the second voltage node when the second enable signal is activated in the period after power up,
   wherein the increasing of the voltage of the second voltage node comprises:
      selecting one of the enable signal and the second enable signal in response to a power up signal and outputting an oscillation enable signal in response to the selection;
      generating an oscillation signal in an activation period of the oscillation enable signal; and
      performing a charge pumping operation in response to oscillation of the oscillation signal and increasing the voltage of the second voltage node.

7. The method of claim 6, wherein the difference between the voltages of the first and second nodes is adjusted in response to a change in the voltage of the first voltage node.

8. The method of claim 7, wherein the activating of the enable signal comprises:
   dividing the voltage of the first voltage node at a first division ratio in the period before power up to generate a first divided voltage;
   dividing the voltage of the second voltage node at a second division ratio in the period before power up to generate a second divided voltage; and
   comparing the first divided voltage with the second divided voltage in the period before power up and determining whether to activate the enable signal in response to the comparison.

9. The method of claim 8, wherein the second division ratio has a value larger than the first division ratio, and when the first divided voltage is substantially equal to the second divided voltage, the voltage of the first voltage node is lower than the voltage of the second voltage node by the first voltage difference.

10. The method of claim 9, wherein the voltage of the first voltage node is a power supply voltage and the voltage of the second voltage node is a boosting voltage.

11. A method for operating a semiconductor device, comprising:
   activating a power up signal when a voltage of a first voltage node is higher than a first voltage and entering a period before power up;
   activating an oscillation enable signal when the voltage of the first voltage node is higher than a voltage of a second voltage node in the period before power up;
   deactivating the oscillation enable signal when the voltage of the second voltage node is higher than the voltage of the first voltage node by at least a first voltage difference in the period before power up;
   deactivating the power up signal when the voltage of the first voltage node is higher than a power-up threshold voltage and entering a period after power up;
   activating the oscillation enable signal when the voltage of the second voltage node is lower than a target voltage in the period after power up and deactivating the oscillation enable signal when the voltage of the second voltage node is higher than the target voltage; and
   increasing the voltage of the second voltage node in an activation period of the oscillation enable signal,
   wherein the increasing of the voltage of the second voltage node comprises:
      generating an oscillation signal in an activation period of the oscillation enable signal; and
      performing a charge pumping operation in response to oscillation of the oscillation signal and increasing the voltage of the second voltage node.

12. The method of claim 11, wherein a difference between the voltages of the first and second nodes is adjusted in response to a change in the voltage of the first voltage node.

13. The method of claim 12, wherein the deactivating of the oscillation enable signal in the period before power up comprises:
   dividing the voltage of the first voltage node at a first division ratio in the period before power up to generate a first divided voltage;
   dividing the voltage of the second voltage node at a second division ratio in the period before power up to generate a second divided voltage;
   maintaining an activation state of the oscillation enable signal when the second divided voltage is lower than the first divided voltage in the period before power up; and
   changing the oscillation enable signal to a deactivation state when the second divided voltage is higher than the first divided voltage in the period before power up.

14. The method of claim 13, wherein the second division ratio has a value larger than the first division ratio, and when the first divided voltage is substantially equal to the second divided voltage, the voltage of the first voltage node is lower than the voltage of the second voltage node by a first voltage difference.

15. The method of claim 14, wherein the voltage of the first voltage node is a power supply voltage and the voltage of the second voltage node is a boosting voltage.

* * * * *